(12) United States Patent
Anderson et al.

(10) Patent No.: US 7,964,465 B2
(45) Date of Patent: Jun. 21, 2011

(54) TRANSISTORS HAVING ASYMMETRIC STRAINED SOURCE/DRAIN PORTIONS

(75) Inventors: Brent Alan Anderson, Jericho, VT (US); Andres Bryant, Burlington, VT (US); Edward Joseph Nowak, Essex Junction, VT (US)

(73) Assignee: International Business Machines Corporation, Armonk, NY (US)

( * ) Notice: Subject to any disclaimer, the term of this patent is extended or adjusted under 35 U.S.C. 154(b) by 513 days.

(21) Appl. No.: 12/104,475

(22) Filed: Apr. 17, 2008

(65) Prior Publication Data
US 2009/0263949 A1  Oct. 22, 2009

(51) Int. Cl.
 *H01L 21/336* (2006.01)
(52) U.S. Cl. ............. 438/283; 438/285; 257/E21.621; 257/E21.638; 257/E21.431
(58) Field of Classification Search .............. 438/285, 438/290, 518, 590, 283; 257/E21.621, E21.638, 257/E21.431
See application file for complete search history.

(56) References Cited

U.S. PATENT DOCUMENTS

| | | | |
|---|---|---|---|
| 6,492,216 B1 * | 12/2002 | Yeo et al. ............ | 438/197 |
| 6,638,802 B1 | 10/2003 | Hwang et al. | |
| 7,102,205 B2 | 9/2006 | Chidambarrao et al. | |
| 2006/0043498 A1 * | 3/2006 | Orlowski et al. ........... | 257/396 |
| 2006/0043592 A1 | 3/2006 | Tanaka | |
| 2006/0076625 A1 | 4/2006 | Lee et al. | |
| 2009/0032845 A1 * | 2/2009 | Zhu et al. ............ | 257/192 |
| 2010/0012975 A1 * | 1/2010 | Pal et al. ............. | 257/190 |

* cited by examiner

*Primary Examiner* — Caridad M Everhart
(74) *Attorney, Agent, or Firm* — Schmeiser, Olsen & Watts; Richard M. Kotulak (57) ABSTRACT

A structure formation method. First, a structure is provided including (a) a fin region comprising (i) a first source/drain portion having a first surface and a third surface parallel to each other, not coplanar, and both exposed to a surrounding ambient, (ii) a second source/drain portion having a second surface and a fourth surface parallel to each other, not coplanar, and both exposed to the surrounding ambient, and (iii) a channel region disposed between the first and second source/drain portions, (b) a gate dielectric layer, and (c) a gate electrode region, wherein the gate dielectric layer (i) is sandwiched between, and (ii) electrically insulates the gate electrode region and the channel region. Next, a patterned covering layer is used to cover the first and second surfaces but not the third and fourth surfaces. Then, the first and second source/drain portions are etched at the third and fourth surfaces, respectively.

17 Claims, 10 Drawing Sheets

TRANSISTORS HAVING ASYMMETRIC STRAINED SOURCE/DRAIN PORTIONS

FIELD OF THE INVENTION

The present invention relates to transistors, having asymmetrically strained source/drain portions.

BACKGROUND OF THE INVENTION

In a conventional transistor, source/drain regions are usually etched, and then SiGe (silicon-germanium) or SiC (silicon-carbon) is epitaxially grown on source/drain portions of the fin region to provide strain into a channel region of the FET. However, the resulting structure usually does not have the optimum strain in the channel region. Therefore, there is a need for a method of forming a transistor that provides strain in the channel region higher than that of prior art.

SUMMARY OF THE INVENTION

The present invention provides a structure fabrication method. The method comprises providing a structure which includes (a) a fin region comprising a first semiconductor material, wherein the fin region includes (i) a first source/drain portion having a first surface and a third surface, wherein the first and third surfaces are parallel to each other, not coplanar, and both exposed to a surrounding ambient, (ii) a second source/drain portion having a second surface and a fourth surface, wherein the second and fourth surfaces are parallel to each other, not coplanar, and both exposed to the surrounding ambient, and (iii) a channel region disposed between the first and second source/drain portions, (b) a gate dielectric layer in direct physical contact with the channel region, and (c) a gate electrode region in direct physical contact with the gate dielectric layer, wherein the gate dielectric layer (i) is sandwiched between, and (ii) electrically insulates the gate electrode region and the channel region. The method further comprises after said providing is performed, covering the first and second surfaces but not the third and fourth surfaces with a patterned covering layer; and after said covering is performed, etching the first and second source/drain portions at the third and fourth surfaces, respectively.

The present invention provides a method of forming a transistor structure in which the channel region has higher strain than that of the prior art.

BRIEF DESCRIPTION OF THE DRAWINGS

FIGS. 1A-1Eb (perspective and top-down views) illustrate a fabrication process for forming a vertical transistor (FinFET) structure, in accordance with embodiments of the present invention.

FIGS. 2A-2Db (cross-section and top-down views) illustrate another fabrication process for forming another vertical transistor (FinFET) structure, in accordance with embodiments of the present invention.

DETAILED DESCRIPTION OF THE INVENTION

Figure 1:
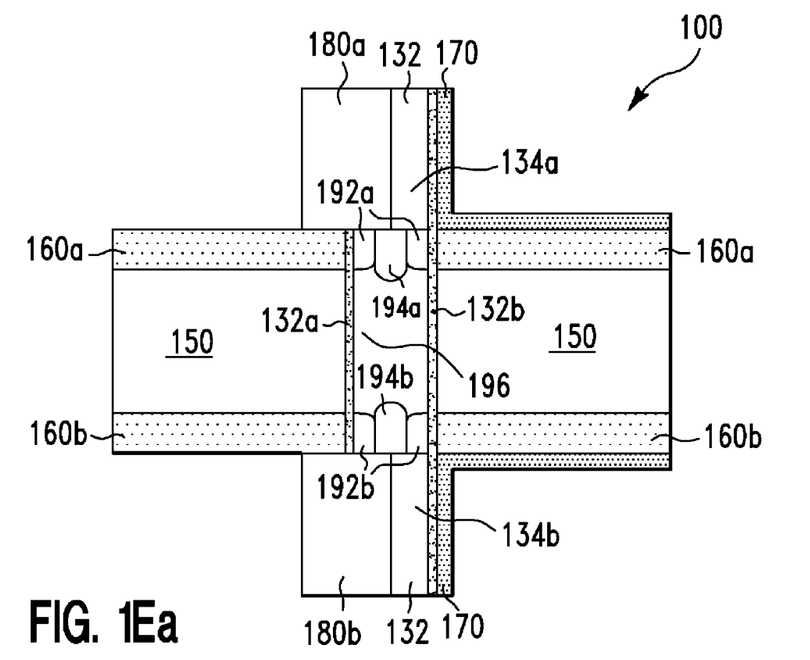
Figure 1A:
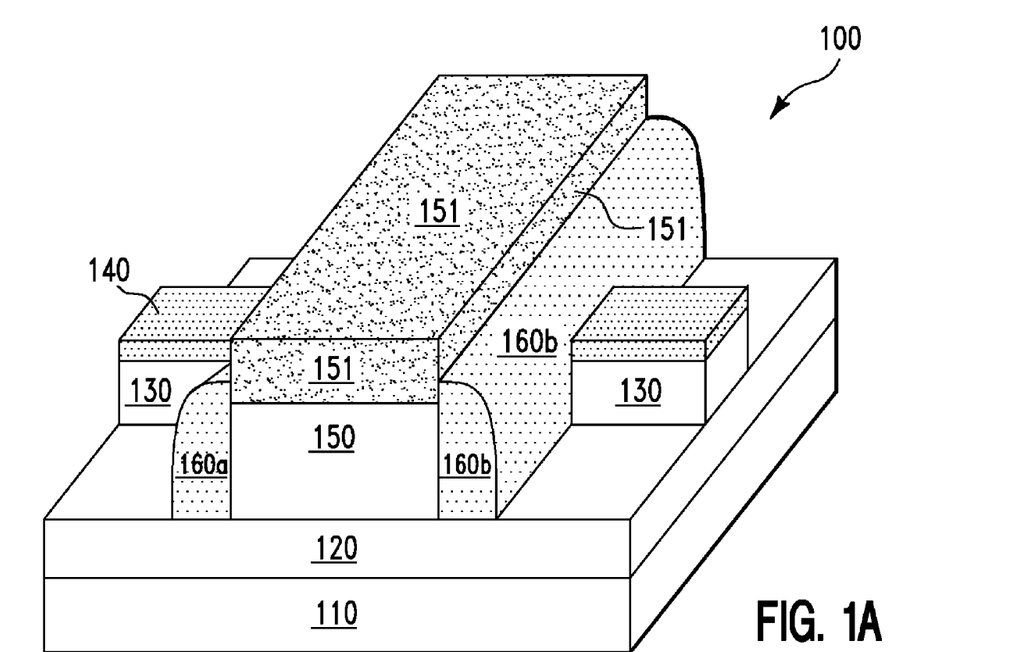

FIGS. 1A-1Eb (perspective views) illustrate a fabrication process for forming a vertical transistor (FinFET) structure 100, in accordance with embodiments of the present invention. More specifically, with reference to FIG. 1A, the fabrication of the vertical transistor structure 100 starts out with a structure including (i) a silicon (Si) substrate 110, (ii) a BOX (Buried Oxide) layer 120 on top of the Si substrate 110, (iii) a fin region 130 (comprising silicon in one embodiment) on top of the BOX layer 120, (iv) a hard mask 140 (comprising silicon nitride in one embodiment) on top of the fin region 130, (v) a gate electrode region 150 (comprising polysilicon in one embodiment) on top of the hard mask 140 and the BOX layer 120, (vi) a dielectric cap region 151 (comprising SiO2 in one embodiment) on top of the gate electrode region 150, and (vii) nitride spacers 160a and 160b (comprising silicon nitride in one embodiment) on side walls of the gate electrode region 150 and the dielectric cap region 151. The vertical transistor structure 100 of FIG. 1A is formed by using a conventional method.

Figure 1B:
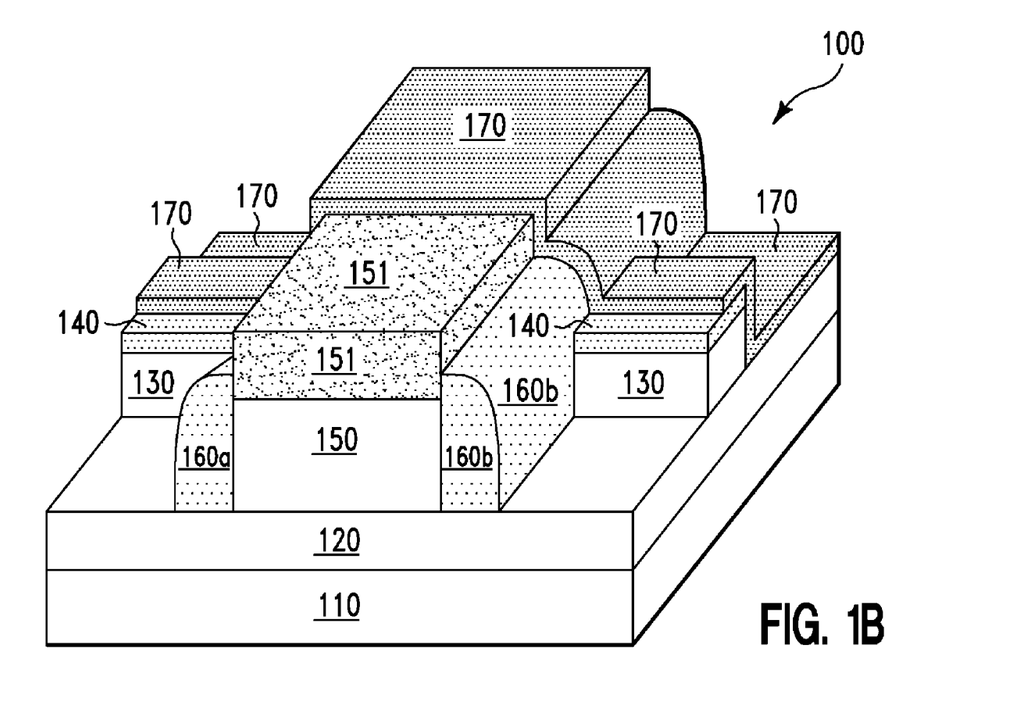

Next, with reference to FIG. 1B, in one embodiment, a patterned dielectric (e.g., silicon nitride, etc.) covering layer 170 is formed on top of the structure 100 of FIG. 1A. More specifically, the patterned nitride covering layer 170 is formed by using conventional lithographic and etching processes.

Next, in one embodiment, the fin region 130 is etched with the patterned nitride covering layer 170, the hard mask 140, and the nitride spacers 160a and 160b serving as a blocking mask. The etching of the fin region 130 is performed essentially without affecting the BOX layer 120. As a result of the etching, the fin region 130 of FIG. 1B is reduced to a fin region 132 of FIG. 1C. In other words, exposed surfaces of the fin region 130 are moved in a direction 133. The etching of the fin region 130 can be isotropic.

Figure 1C:
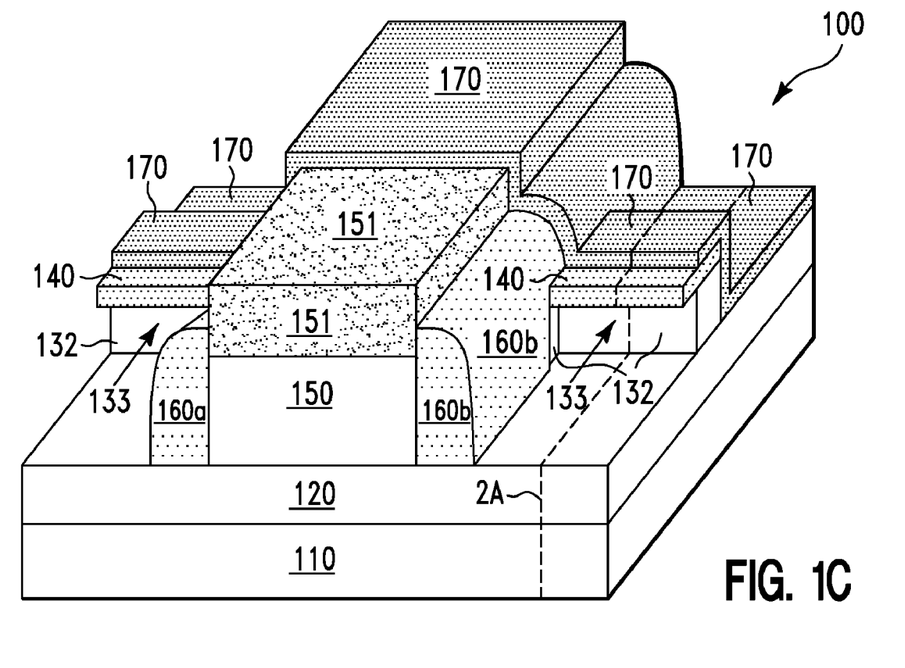
Figure 1D:
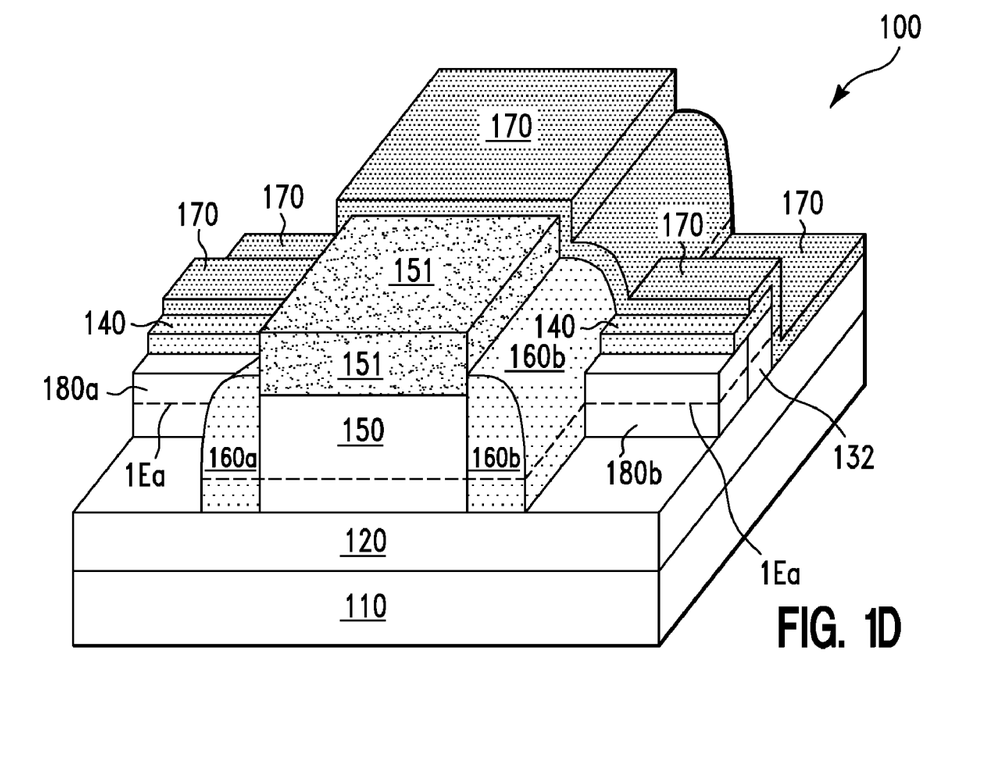

Next, in one embodiment, SiGe (silicon-germanium) material can be epitaxially grown on exposed silicon surfaces of the structure 100 of FIG. 1C, resulting in SiGe regions 180a and 180b of FIG. 1D.

FIG. 1Ea shows a cross-section view of the vertical transistor structure 100 of FIG. 1D along a plane defined by a line 1Ea, in accordance with embodiments of the present invention. With reference to FIG. 1Ea, the vertical transistor structure 100 comprises gate dielectric layers 132a and 132b between the gate electrode region 150 and the fin region 132, extension regions 192a and 192b implanted in the fin region 132, halo regions 194a and 194b implanted in the fin region 132, and a channel region 196 between the two extension regions 192a and 192b. It should be noted that the gate dielectric layers 132a and 132b, the extension regions 192a and 192b, the halo regions 194a and 194b, and the channel region 196 are already present in the structure 100 of FIGS. 1A-1D but these layer and regions were not shown or mentioned above with reference to FIGS. 1A-1D for simplicity. In FIG. 1Ea, in one embodiment, the SiGe regions 180a and 180b are on the same side of the fin region 132. In the embodiments described above, the extension regions 192a and 192b and the halo regions 194a and 194b are formed early and are present even in FIG. 1A (though not shown in FIG. 1A for simplicity). Alternatively, the extension regions 192a and 192b and the halo regions 194a and 194b can be formed after the formation of the SiGe regions 180a and 180b (FIG. 1D).

The SiGe regions 180a and 180b will be parts of source/drain regions, which comprise source/drain portions 134a and 134b, respectively, of the fin region 132 of the vertical transistor structure 100. The presence of the SiGe regions 180a and 180b (also called strain creating regions 180a and 180b) in the vertical transistor structure 100 creates strain in the channel region 196 of the vertical transistor structure 100. As a result, the strain in the channel region of the vertical transistor structure 100 is improved. It should be noted that this strain in the channel region 196 is created because the crystal lattice of the material of the strain creating regions 180a and 180b (i.e., SiGe) does not match the crystal lattice of the material of the channel region 196 (i.e., Si). In an alternative embodiment, the strain creating regions 180a and 180b can comprise SiC (mixture of silicon and carbon) for an NFET transistor.

FIG. 1Eb shows a cross-section view of a vertical transistor structure 100', in accordance with embodiments of the present invention. The vertical transistor structure 100' is similar to the vertical transistor structure 100 in FIG. 1Ea, except that SiGe regions 180a' and 180b' are on opposite sides of the fin region 132. In order to form the SiGe regions 180a' and 180b' on opposite sides of the fin region 132, the patterned nitride covering layer 170 (similar to the patterned nitride covering layer 170 in FIG. 1C) is formed in two opposite sides, and the step of etching the fin region 130 (similar to the etching step to form the structure of FIG. 1C) is performed such that exposed surfaces of the fin region 130 are moved in two opposite directions. It should be noted that a gate dielectric layer, extension regions, halo regions, and a channel region of the vertical transistor structure 100' are omitted in FIG. 1Eb for simplicity. The presence of the SiGe regions 180a' and 180b' in the vertical transistor structure 100' improves the strain in the channel region of the vertical transistor structure 100' and thereby improves the operation of the vertical transistor structure 100'.

Figure 2:
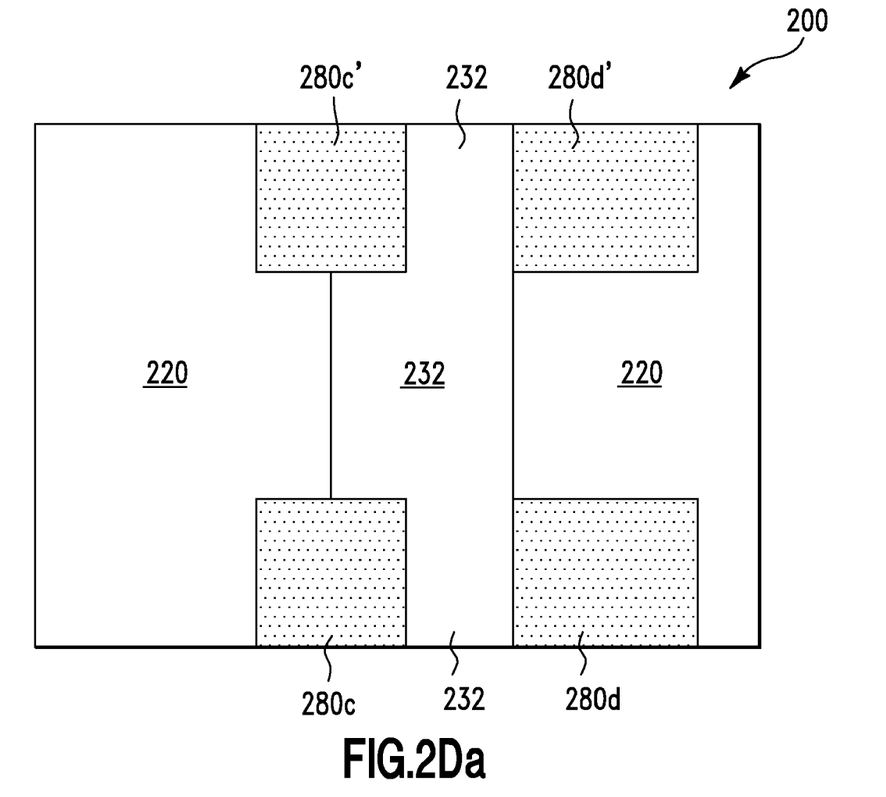
Figure 2A:
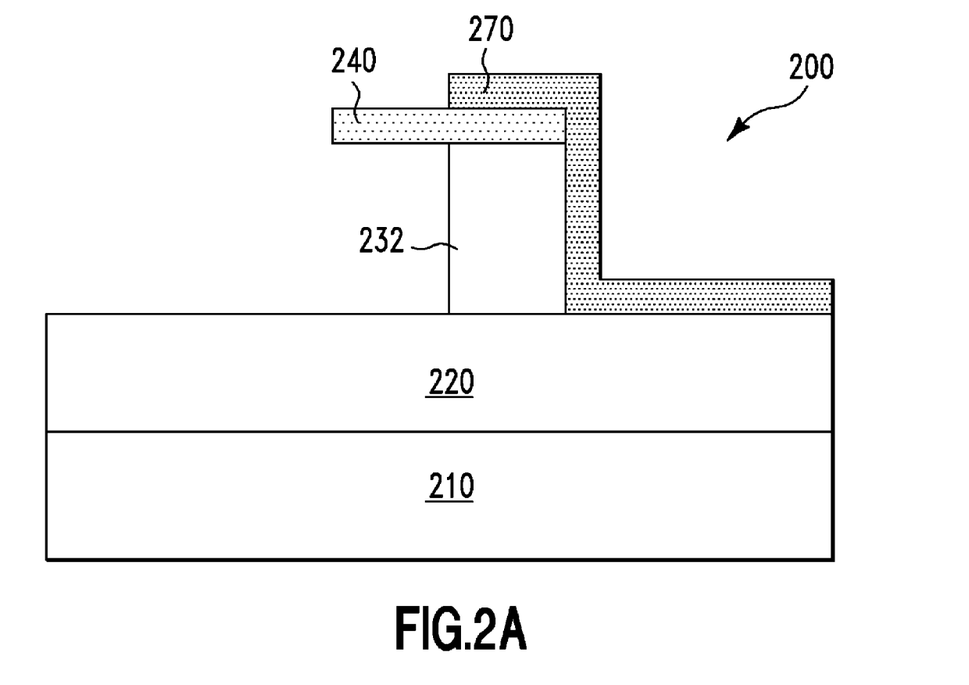

FIGS. 2A-2Db (cross-section views) illustrate a fabrication process for forming a vertical transistor (FinFET) structure 200, in accordance with embodiments of the present invention. More specifically, the fabrication process starts out with a structure which is similar to the structure 100 of FIG. 1C. FIG. 2A shows a cross-section view of the vertical transistor structure 100 of FIG. 1C along a plane defined by a line 2A. It should be noted that similar regions of the structure 200 of FIG. 2A and the structure 100 of FIG. 1C have the same reference numerals, except for the first digit, which is used to indicate the figure number. For instance, a patterned dielectric (e.g., silicon nitride) covering layer 270 (FIG. 2A) and the patterned nitride covering layer 170 (FIG. 1C) are similar.

Figure 2B:
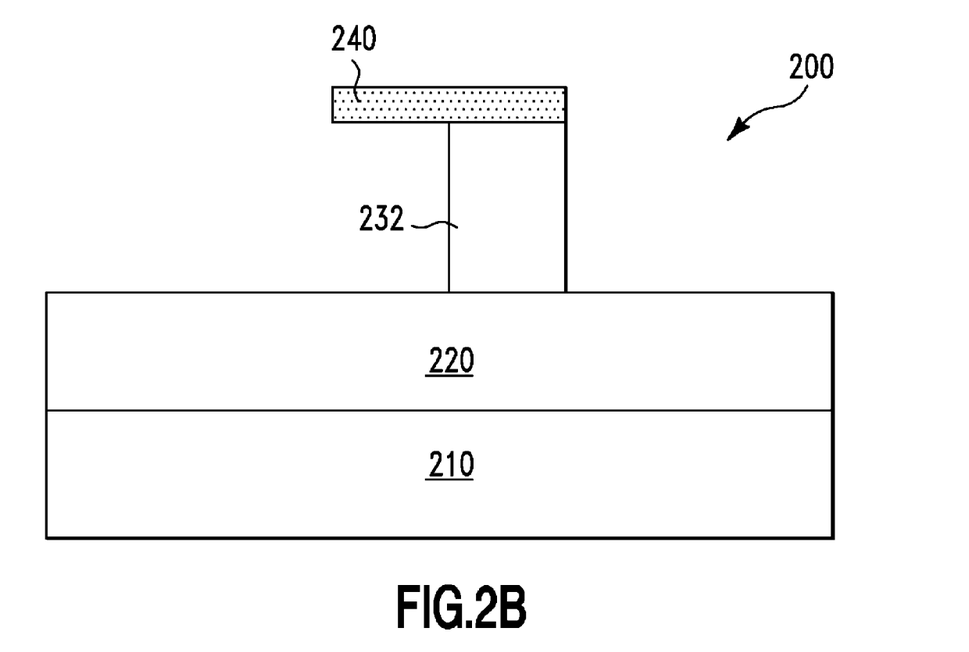

Next, in one embodiment, the patterned nitride covering layer 270 is removed by an etching step which is essentially selective to a hard mask 240, a fin region 232, and a BOX layer 220, resulting in the structure 200 of FIG. 2B. In one embodiment, the removal of the patterned nitride covering layer 270 can be achieved by an isotropic etch such as a wet etch or a plasma etch.

Figure 2C:
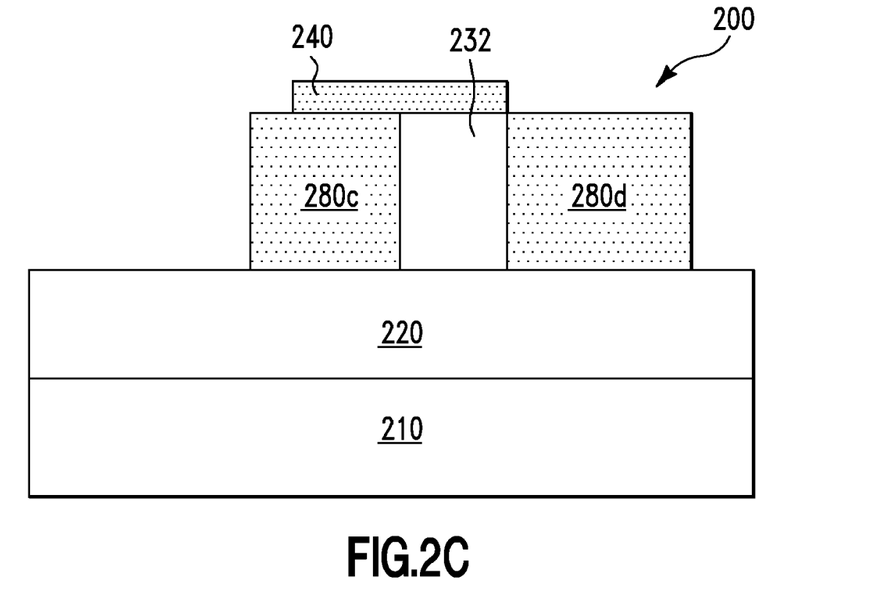

Next, in one embodiment, SiGe material can be epitaxially grown on exposed silicon surfaces of the structure 200 of FIG. 2B, resulting in SiGe regions 280c and 280d of FIG. 2C.

FIG. 2Da shows a top-down view of structure 200 of FIG. 2C, in accordance with embodiments of the present invention. For illustration and simplicity, only the SiGe regions 280c, 280d, 280c', and 280d', the fin region 232, the BOX layer 220 are shown in FIG. 2Da. The formations of SiGe regions 280c' and 280d' are similar to the formations of the SiGe regions 280c and 280d. As can be seen FIG. 2Da, in one embodiment, the fin region 232 was recessed at two places on one side (left side) of the fin region 232.

The SiGe regions 280c, 280d, 280c', and 280d' will be parts of source/drain regions of the vertical transistor structure 200. The presence of the SiGe regions 280c and 280c' in the vertical transistor structure 200 creates strain in the channel region of the vertical transistor structure 200. As a result, the strain in the channel region of the vertical transistor structure 200 is improved thereby improving the operation of the vertical transistor structure 200.

FIG. 2Db shows a top-down view of a vertical transistor structure 200', in accordance with alternative embodiments of the present invention. The vertical transistor structure 200' is similar to the vertical transistor structure 200 of FIG. 2Da, except that the fin region 232 was recessed at two places on opposite sides of the fin region 232.

The SiGe regions 280c, 280c', 280d, and 280d' (also called expansion regions 280c, 280c', 280d, and 280d') will be parts of source/drain regions of the vertical transistor structure 200'. The source/drain regions of the vertical transistor structure 200' comprise source/drain portions 234a and 234b of the fin region 232 of the vertical transistor structure 200'. The source/drain portion 234a has surfaces 281 and 282 on which the SiGe regions 280c and 280d reside, respectively. The source/drain portion 234b has surfaces 281' and 282' on which the SiGe regions 280c' and 280d' reside, respectively. The surface 281 is not coplanar with surface 282'. Similarly, the surface 282 is not coplanar with either the surface 281' or the surface 282'. The presence of the SiGe regions 280c and 280c' in the vertical transistor structure 200' creates strain in the channel region of the vertical transistor structure 200'.

Figure 3A:
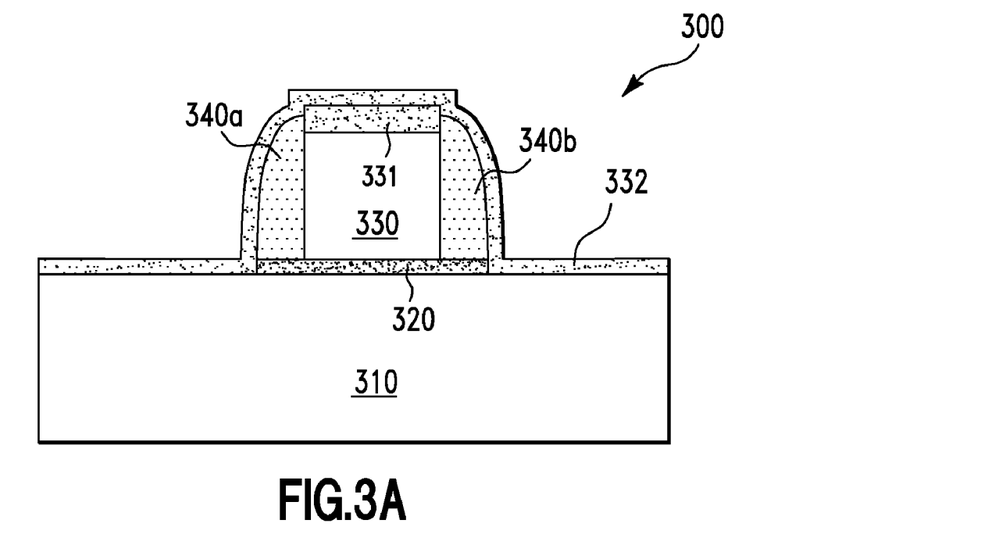
FIGS. 3A-3E (cross-section views) illustrate a fabrication process for forming a planar transistor structure, in accordance with embodiments of the present invention.

FIGS. 3A-3E (cross-section views) illustrate a fabrication process for forming a planar transistor structure 300, in accordance with embodiments of the present invention. More specifically, with reference to FIG. 3A, the fabrication of the planar transistor structure 300 starts out with a structure including (i) a silicon substrate 310, (ii) a gate dielectric layer 320 (comprising silicon dioxide in one embodiment) on top of the Si substrate 310, (iii) a gate electrode region 330 (comprising polysilicon in one embodiment) on top of the gate dielectric layer 320, (iv) a dielectric cap region 331 (comprising SiO2 in one embodiment) on top of the gate electrode region 330, (v) nitride spacers 340a and 340b (comprising silicon nitride in one embodiment) on side walls of the gate electrode region 330 and the dielectric cap region 331, and (vi) a dielectric covering layer 332 (comprising SiO2 in one embodiment) on top of all. The planar transistor structure 300 of FIG. 3A is formed by using a conventional method.

Figure 3B:
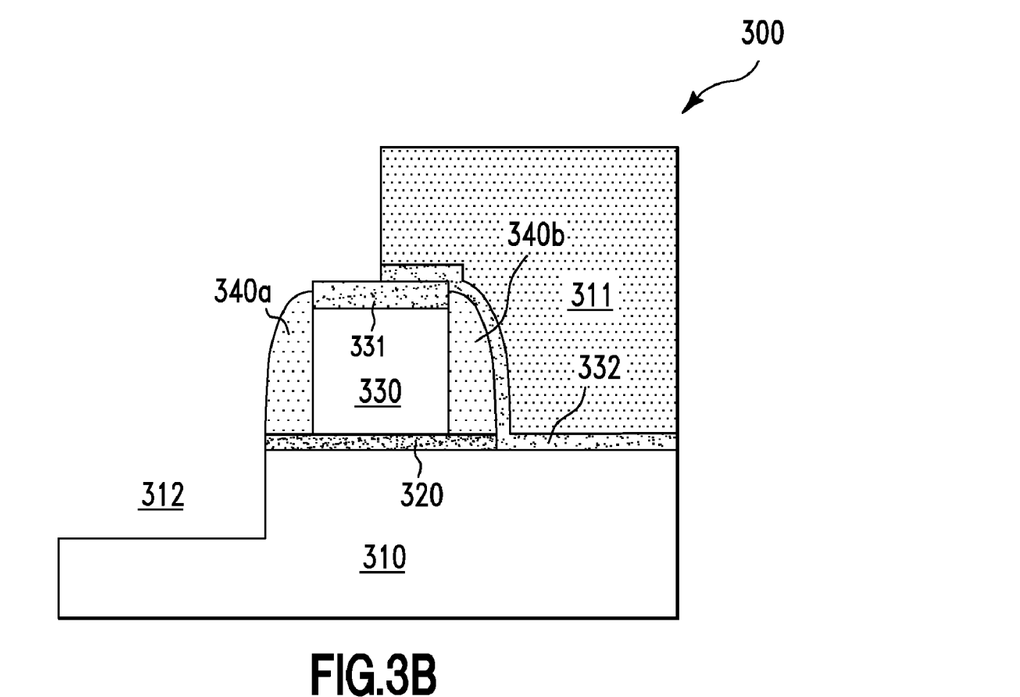

Next, with reference to FIG. 3B, in one embodiment, a patterned photo-resist layer 311 is formed on top of the Si substrate 310. In one embodiment, the patterned photo-resist layer 311 is formed by using a conventional lithographic process.

Next, in one embodiment, portions of the dielectric covering layer 332 not covered by the patterned photo-resist layer 311 are removed by a wet etching process. Then, the Si substrate 310 is etched with the patterned photo-resist layer 311, the dielectric cap region 331, and the nitride spacers 340a and 340b serving as a blocking mask, resulting in a trench 312 in the Si substrate 310. The etching of the Si substrate 310 can be dry etching. The trench 312 is formed aligned with the nitride spacer 340a. It should be noted that during the etching of the Si substrate 310, the gate electrode region 330 is not etched because the gate electrode region 330 is protected by the dielectric cap region 331. After that, the patterned photo-resist layer 311 can be removed using a wet etching process.

Figure 3C:
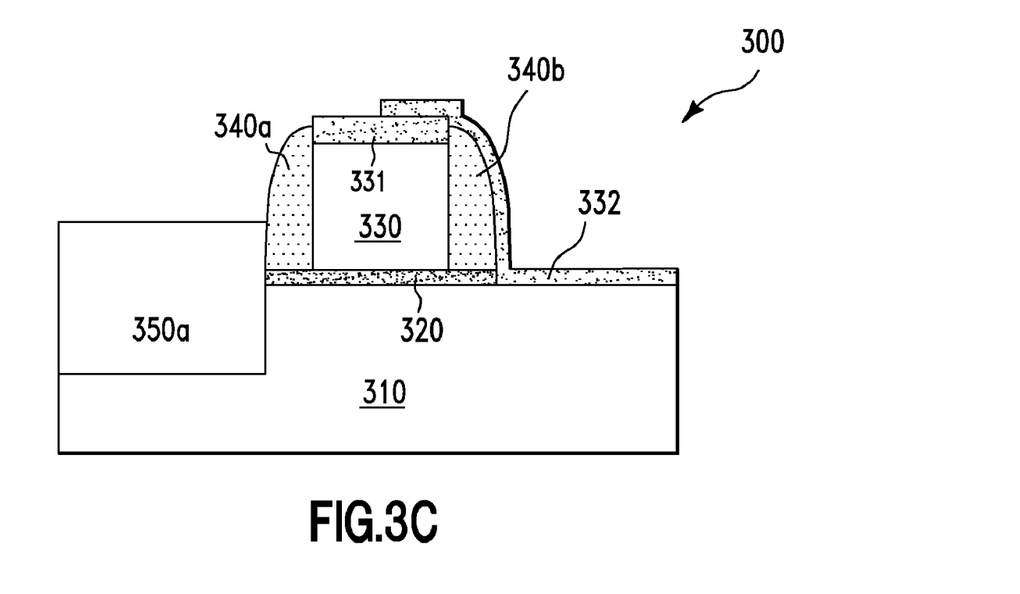

Next, in one embodiment, SiGe material can be epitaxially grown on exposed silicon surface of the trench 312 of FIG. 3B, resulting in a SiGe region 350a of FIG. 3C. It should be noted that SiGe material does not grow on the right side of the gate electrode region 330 because the Si substrate 310 on this right side is still covered/protected by the dielectric covering layer 332.

Figure 3D:
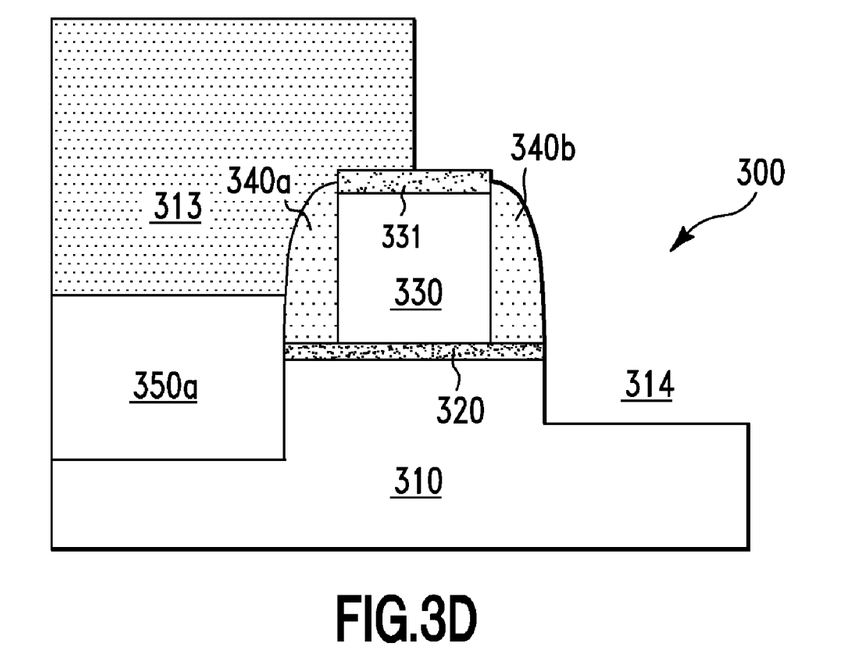

Next, in one embodiment where the depths and thicknesses of the grown SiGe on both sides are asymmetric, FIG. 3C is modified to form FIG. 3D. More specifically, with reference to FIG. 3D, a patterned photo-resist layer 313 is formed on top of the SiGe region 350a. In one embodiment, the patterned photo-resist layer 313 is formed by using a conventional lithographic process.

Next, in one embodiment, the remaining portions of the dielectric covering layer 332 (FIG. 3C) are removed. Then, the Si substrate 310 is etched with the patterned photo-resist layer 313, the dielectric cap region 331, and the nitride spacers 340a and 340b serving as a blocking mask, resulting in a trench 314 in the Si substrate 310. The etching of the Si substrate 310 can be dry etching. The trench 314 is formed aligned with the nitride spacer 340b. It should be noted that during the etching of the Si substrate 310, the gate electrode region 330 is not etched because the gate electrode region 330 is protected by the dielectric cap region 331. After the trench 314 is formed, the patterned photo-resist layer 313 can be removed using a wet etching process.

Figure 3E:
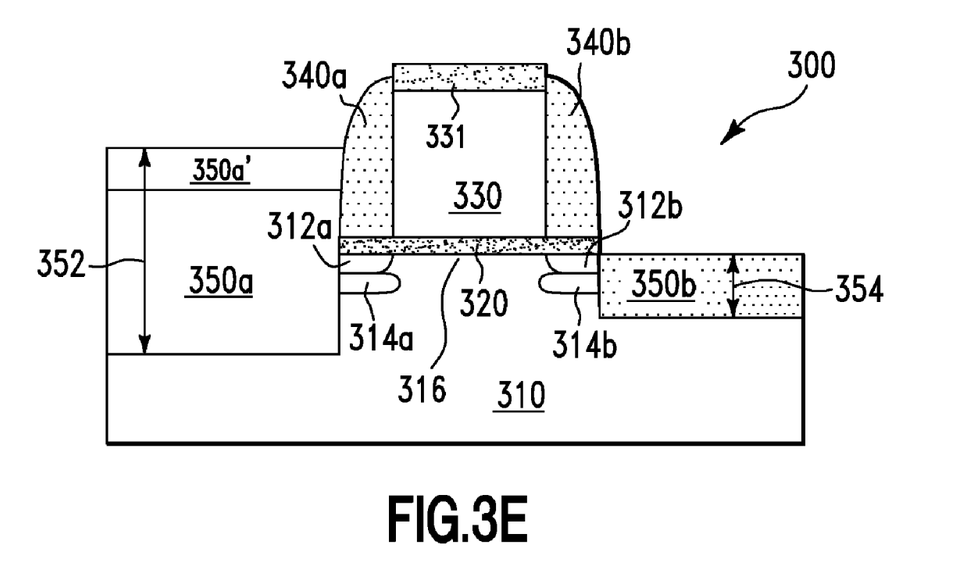

Next, in one embodiment, SiGe material can be epitaxially grown on exposed silicon surface of the trench 314 of FIG. 3D, resulting in SiGe regions 350a' and 350b of FIG. 3E. In one embodiment, a thickness 352 of the SiGe region 350a+350a' is greater than a thickness 354 of the SiGe region 350b. It should be noted that during the formation of SiGe region 350b, SiGe material also grows on the SiGe region 350a (on the left) resulting in the SiGe region 350a'.

With reference to FIG. 3E, the planar transistor structure 300 comprises extension regions 312a and 312b implanted in the Si substrate 310, halo regions 314a and 314b implanted in the Si substrate 310, and a channel region 316 between the two extension regions 312a and 312b. It should be noted that the extension regions 312a and 312b, the halo regions 314a and 314b, and the channel region 316 may already be present in the structure 300 of FIGS. 3A-3D (in one embodiment) but these layer and regions are not shown or mentioned above with reference to FIGS. 3A-3D for simplicity. The SiGe regions 350a+350a' and 350b will be parts of source/drain regions of the planar transistor structure 300. The presence of the SiGe source/drain regions 350a+350a' and 350b in the planar transistor structure 300 creates strain in the channel region 316 of the planar transistor structure 300. As a result, the operation of the planar transistor structure 300 is improved.

In the embodiment described in FIGS. 3A-3E above, the source/drain regions 350a+350a' and 350b comprise SiGe. Alternatively, one of the source/drain regions 350a+350a' and 350b comprises Si, whereas the other of the source/drain regions 350a+350a' and 350b comprises SiGe.

Figure 4A:
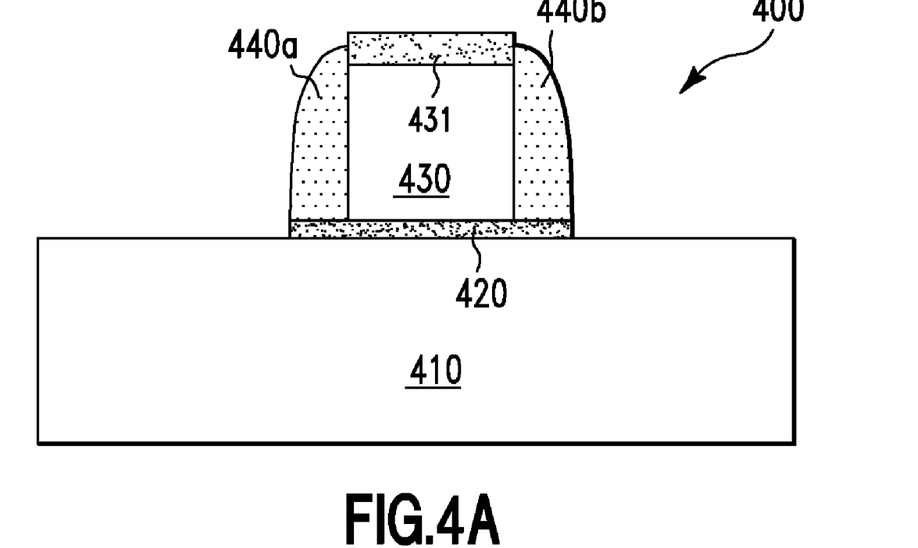
FIGS. 4A-4D (cross-section views) illustrate another fabrication process for forming another planar transistor structure, in accordance with embodiments of the present invention.

FIGS. 4A-4D (cross-section views) illustrate a fabrication process for forming a planar transistor structure 400, in accordance with embodiments of the present invention. More specifically, the fabrication process starts out with the structure 400 of FIG. 4A. In one embodiment, the structure 400 of FIG. 4A is similar to the structure 300 of FIG. 3A (without the dielectric covering layer 332). It should be noted that similar regions of the structure 400 of FIG. 4A and the structure 300 of FIG. 3A have the same reference numerals, except for the first digit, which is used to indicate the figure number. For instance, a gate dielectric layer 420 (FIG. 4A) and the gate dielectric layer 320 (FIG. 3A) are similar.

Figure 4B:
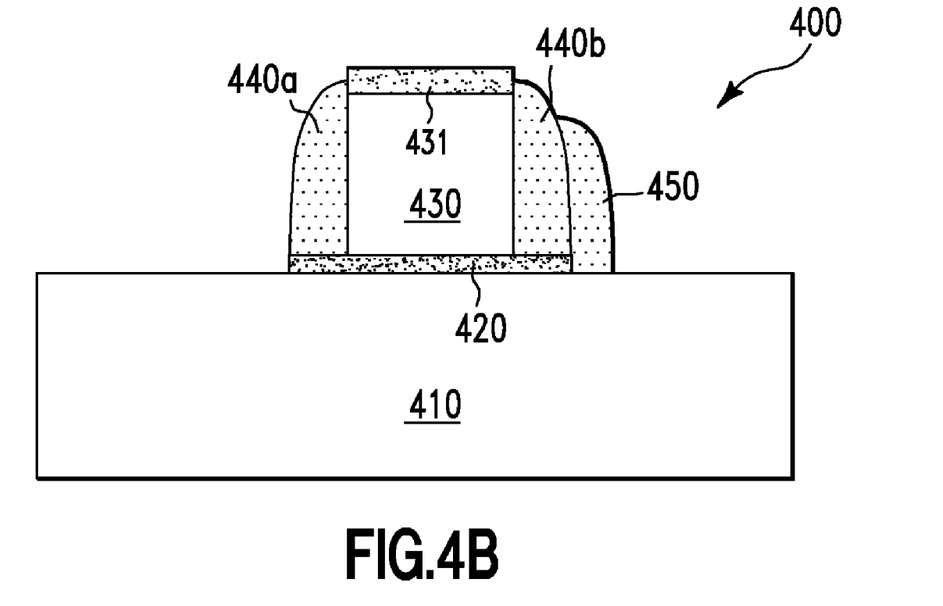

Next, with reference to FIG. 4B, in one embodiment, an extra nitride spacer 450 is formed on side wall of a nitride spacer 440b. Illustratively, the extra nitride spacer 450 is formed by using a conventional process.

Figure 4C:
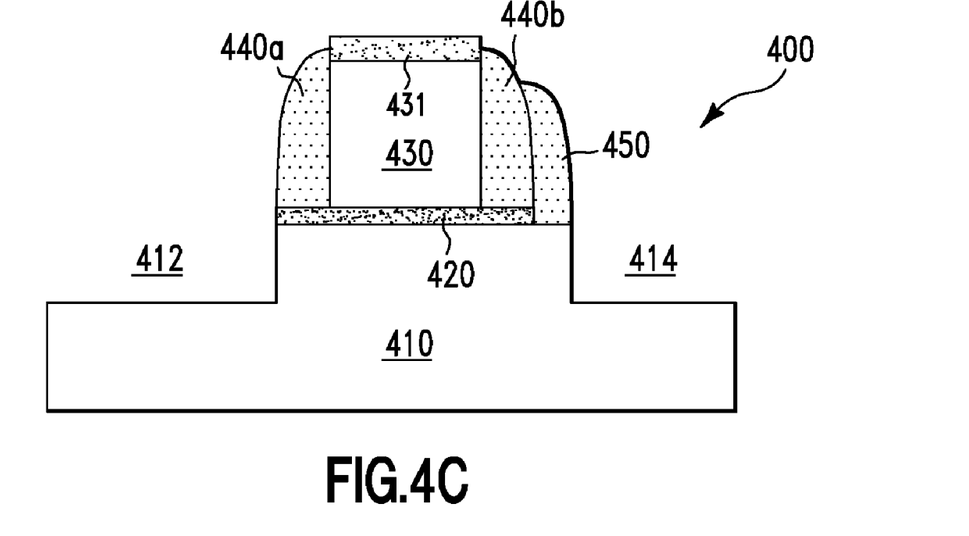

Next, with reference to FIG. 4C, in one embodiment, the Si substrate 410 is etched with the extra nitride spacer 450, the nitride spacers 440a and 440b, and the dielectric cap region 431 serving as a blocking mask resulting in trenches 412 and 414 in the Si substrate 410. The etching of the Si substrate 410 can be dry etching. The trenches 412 and 414 are formed aligned with the nitride spacer 440a and the extra nitride spacer 450, respectively.

Figure 4D:
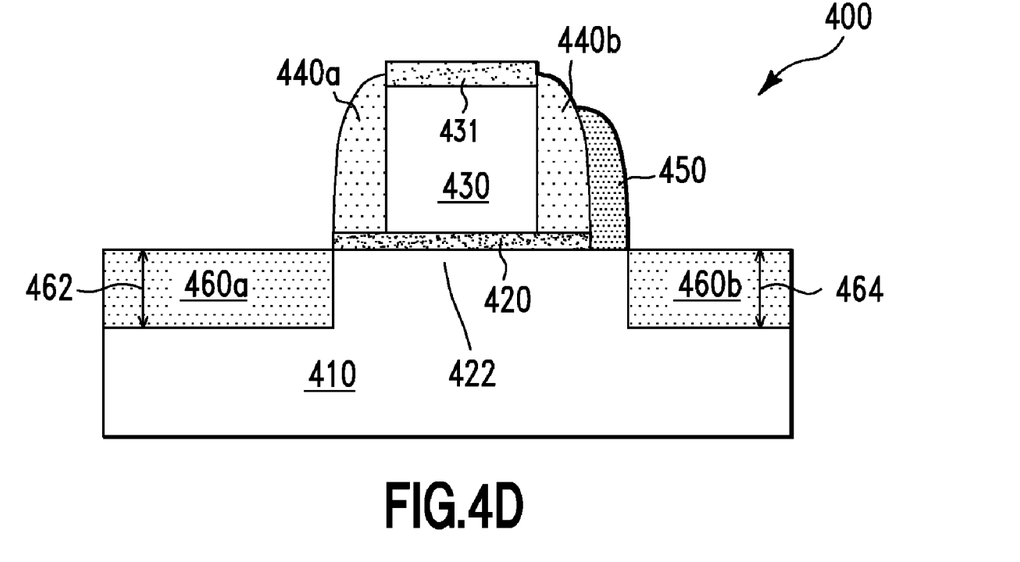

Next, in one embodiment, SiGe material can be epitaxially grown on exposed silicon surface of the trenches 412 and 414 of FIG. 4C, resulting in SiGe regions 460a and 460b, respectively, of FIG. 4D. It should be noted that thicknesses 462 and 464 of the SiGe regions 460a and 460b, respectively, are the same.

The SiGe regions 460a and 460b will be parts of source/drain regions of the planar transistor structure 400. The presence of the SiGe source/drain regions 460a and 460b in the planar transistor structure 400 creates strain in channel region 422 of the planar transistor structure 400. As a result, the operation of the planar transistor structure 400 is improved.

In the embodiment described in FIGS. 4A-4D above, the source/drain regions 460a and 460b comprise SiGe. Alternatively, one of the source/drain regions 460a and 460b comprises Si, whereas the other of the source/drain regions 460a and 460b comprises SiGe.

In the embodiments described above, SiGe material is used. Alternatively, compound semiconductors including silicon, carbon, germanium, etc are used.

It should be noted that in the embodiments described above, the SiGe regions will later be doped with dopants so that they can serve as parts of the source/drain regions of the transistors.

In the embodiments described above, SiGe is epitaxially grown resulting the regions 180a and 180b (FIG. 1D), regions 280c and 280d (FIG. 2C), region 350a (FIG. 3C), regions 350a' and 350b (FIG. 3E), and regions 460a and 460b (FIG. 4D). Alternatively, instead of SiGe, any other strain-creating material can be used provided that the resulting regions create strain in the corresponding channel regions. For example, SiC (a mixture of silicon and carbon) can be used instead of SiGe to create optimal strain if the structure is to be an NFET.

While particular embodiments of the present invention have been described herein for purposes of illustration, many modifications and changes will become apparent to those skilled in the art. Accordingly, the appended claims are intended to encompass all such modifications and changes as fall within the true spirit and scope of this invention.

What is claimed is:

1. A structure fabrication method, comprising:
   providing a structure which includes:
   (a) a fin region comprising a first semiconductor material, wherein the fin region includes:
      (i) a first source/drain portion having a first surface and a third surface, wherein the first and third surfaces are parallel to each other, not coplanar, and both exposed to a surrounding ambient,
      (ii) a second source/drain portion having a second surface and a fourth surface, wherein the second and fourth surfaces are parallel to each other, not coplanar, and both exposed to the surrounding ambient, and
      (iii) a channel region disposed between the first and second source/drain portions,
   (b) a gate dielectric layer in direct physical contact with the channel region, and
   (c) a gate electrode region in direct physical contact with the gate dielectric layer, wherein the gate dielectric layer (i) is sandwiched between, and (ii) electrically insulates the gate electrode region and the channel region;

after said providing is performed, covering the first and second surfaces but not the third and fourth surfaces with a patterned covering layer; and after said covering is performed, etching the first and second source/drain portions at the third and fourth surfaces, respectively.

2. The method of claim 1, wherein the first semiconductor material comprises silicon.

3. The method of claim 1, further comprising, after said etching the first and second source/drain portions is performed, forming a first strain creating region and a second strain creating region on the third and fourth surfaces, respectively, wherein the first and second strain creating regions comprise a second semiconductor material.

4. The method of claim 3, wherein as a result of said etching the first and second source/drain portions being performed, the third and fourth surfaces move in two opposite directions.

5. The method of claim 3, wherein the second semiconductor material is different from the first semiconductor material.

6. The method of claim 3, wherein said forming the first and second strain creating regions comprises epitaxially growing the second semiconductor material on the third and fourth surfaces, respectively.

7. The method of claim 3, wherein the second semiconductor material comprises SiGe (silicon-germanium).

8. The method of claim 3, wherein as a result of said etching the first and second source/drain portions being performed, the third and fourth surfaces move in a same direction.

9. The method of claim 8, wherein the first and second surfaces are coplanar.

10. The method of claim 3, further comprising, after said etching the first and second source/drain portions is performed, forming a third strain creating region and a fourth strain creating region on the first and second surfaces of the first and second source/drain regions, respectively, wherein the third and fourth strain creating regions comprise the second semiconductor material.

11. The method of claim 10, wherein said forming the first, second, third and fourth strain creating regions are performed simultaneously.

12. The method of claim 10, further comprising, after said etching the first and second source/drain portions is performed, and before said forming the third and fourth strain creating regions is performed, removing the patterned covering layer resulting in the first and second surfaces of the first and second source/drain regions, respectively, being exposed to the surrounding ambient.

13. A structure fabrication method, comprising:
providing a structure which includes:
(a) a semiconductor region including:
(i) a first source/drain region,
(ii) a second source/drain region, and
(iii) a channel region disposed between the first and second source/drain regions,
(b) a gate dielectric layer in direct physical contact with the channel region, wherein a common interfacing surface of the channel region and the gate dielectric layer defines a reference direction perpendicular to the common interfacing surface, and
(c) a gate electrode region in direct physical contact with the gate dielectric layer, wherein the gate dielectric layer (i) is sandwiched between and (ii) electrically insulates the gate electrode region and the channel region;

after said providing is performed, etching the first source/drain region but not the second source/drain region, resulting in a first trench in the first source/drain region;

after said etching the first source/drain region is performed, forming a first strain creating region in the first trench;

after said etching the first source/drain region is performed, etching the second source/drain region but not the first source/drain region, resulting in a second trench in the second source/drain region; and after said etching the etching the second source/drain region is performed, forming a second strain creating region in the second trench.

14. The method of claim 13, wherein in the reference direction, a first thickness of the first strain creating region is greater than a second thickness of the second strain creating region.

15. The method of claim 13,
wherein the semiconductor region comprises silicon, and
wherein the first and second strain creating regions comprise SiGe (silicon-germanium).

16. A structure fabrication method, comprising:
providing a structure which includes:
(a) a semiconductor region including:
(i) a first source/drain region,
(ii) a second source/drain region, and
(iii) a channel region disposed between the first and second source/drain regions,
(b) a gate dielectric layer in direct physical contact with the channel region, wherein a common interfacing surface of the channel region and the gate dielectric layer defines a reference direction perpendicular to the common interfacing surface,
(c) a gate electrode region in direct physical contact with the gate dielectric layer, wherein the gate dielectric layer (i) is sandwiched between and (ii) electrically insulates the gate electrode region and the channel region, and
(d) a first dielectric spacer and the second dielectric spacer on side walls of the gate electrode region;

forming an extra dielectric spacer on a side wall of the second dielectric spacer such that the second dielectric spacer is sandwiched between the gate electrode region and the extra dielectric spacer;

etching the first and second source/drain regions, resulting in a first trench and a second trench in the first and second source/drain regions, respectively; and forming a first strain creating region and a second strain creating region in the first and second trenches, respectively.

17. The method of claim 16,
wherein the semiconductor region comprises silicon, and
wherein the first and second strain creating regions comprise SiGe (silicon-germanium).

\* \* \* \* \*